(12) United States Patent
Iinuma

(10) Patent No.: US 7,754,517 B2
(45) Date of Patent: Jul. 13, 2010

(54) METHOD FOR MANUFACTURING INFRARED DETECTING DEVICE

(75) Inventor: Taikan Iinuma, Hachiouji (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/382,067

(22) Filed: Mar. 6, 2009

(65) Prior Publication Data

US 2009/0275166 A1 Nov. 5, 2009

(30) Foreign Application Priority Data

Mar. 11, 2008 (JP) .............................. 2008-060862

(51) Int. Cl.
 *H01L 21/00* (2006.01)
(52) U.S. Cl. ..................... 438/54; 438/48; 438/149; 438/479; 438/480; 438/72; 257/E31.127
(58) Field of Classification Search .................. 438/48, 438/54, 72, 74, 149, 479–480; 257/E31.127
See application file for complete search history.

(56) References Cited

U.S. PATENT DOCUMENTS

| 6,806,470 | B2 * | 10/2004 | Iida et al. | 250/338.1 |
| 7,005,644 | B2 * | 2/2006 | Ishikawa et al. | 250/339.04 |
| 7,045,785 | B2 * | 5/2006 | Iida et al. | 250/338.1 |
| 2005/0224714 | A1 * | 10/2005 | Akin et al. | 250/332 |

FOREIGN PATENT DOCUMENTS

| JP | 09-126895 | 5/1997 |
| JP | 4011851 | 9/2007 |

* cited by examiner

*Primary Examiner*—Thanh Nguyen
(74) *Attorney, Agent, or Firm*—Rabin & Berdo, P.C.

(57) ABSTRACT

A semiconductor layer is prepared in which a silicon substrate, a BOX layer and an SOI layer are laminated in this order. A silicon diode section used as an infrared detection portion is formed in the SOI layer. Further, an isolation portion is formed so as to extend from the SOI layer to a predetermined depth of the silicon substrate via the BOX layer. The isolation portion is formed so as to surround an area in which the silicon diode section is formed, and have the form of a circle or a regular polygon more than a regular pentagon in shape. A protective film is formed on the surface of the SOI layer. Thereafter, etching holes that penetrate the protective film, the SOI layer and the BOX layer are formed. The silicon substrate corresponding to each area surrounded by the isolation portion is etched using the etching holes.

7 Claims, 8 Drawing Sheets r1 = rcos (π/4) = 1/√2 r ≒ 0.71r
(THE AMOUNT OF OVERETCH 0.29r)

r2 = rcos (π/6) = √3/2 r ≒ 0.87r
(THE AMOUNT OF OVERETCH 0.13r)

METHOD FOR MANUFACTURING INFRARED DETECTING DEVICE

BACKGROUND OF THE INVENTION

The present invention relates to a method for manufacturing an infrared detecting device.

There has been known an infrared detector using silicon diodes. Each of the silicon diodes has a temperature characteristic that its output voltage changes when the temperature changes under constant current environment, and detects infrared rays or radiation using this property. In order to enhance the sensitivity of a conventional infrared detector, comprised of silicon diodes, the infrared detector is configured in which as shown in, for example, a patent document 1 (Japanese Patent Application No. 4011851), the plural silicon diodes are connected in series through connecting wirings and elements or devices (hereinafter called infrared detecting devices) equipped with the silicon diodes connected in series are disposed in plural form. In the devices shown in the patent document 1, the series-connected silicon diodes are disposed with being folded back to reduce the entire area of devices.

It is general that the shape of each infrared. detecting device has heretofore been assumed as square. The merit of the square shape resides in that the degree of difficulty in processing of the two-way (vertical/horizontal) photolithography technology is low. FIG. 9(A) is a view showing a layout example where square-shaped infrared detecting devices are disposed in linked form. In FIG. 9(A), reference numerals 100 indicate infrared detecting devices. Each of the infrared detecting devices 100 includes a silicon diode section 102 (typically represented as rectangular herein) in which silicon diodes are connected in series, beam portions 104 used as supporters or support bodies for supporting the silicon diode section 102, metal wirings, although not shown in the figure, for connecting the silicon diodes of each silicon diode section 102, etc. The infrared detecting devices 100 are respectively separated by a square-shaped isolation portion 108.

FIG. 9(B) is a view typically showing one example of a sectional view of each infrared detecting device 100. The infrared detecting device 100 is provided with an infrared absorber 112 above its corresponding silicon diode section 102 including plural silicon diodes 120 connected in series, and configured in such a manner that a rise in temperature produced due to the absorption of infrared radiation by the infrared absorber 112 is transmitted to the silicon diode section 102 (incidentally, the infrared absorber 112 is not illustrated in FIG. 9(A)). As shown in FIG. 9(B), a hollow portion 116 is formed in a silicon substrate 110 lying below the silicon diode section 102. The silicon substrate 110 lying below the silicon diode section 102 is hollowed out in this way thereby to enhance the rate of rise in temperature of a sensing portion. Incidentally, an infrared detector in which a hollow portion is formed in a substrate lying below a sensor section has been included even in a patent document 2 (Japanese Unexamined Patent Publication No. Hei 9(1997)-126895).

The hollow portion 116 is formed by providing etching holes 106 (refer to FIG. 9(A)) in each infrared detecting device 100 and supplying XeF2 gas or the like through the etching holes 106. The etching holes 106 are not illustrated in FIG. 9(B). Since this etching approximates to isotropy, the hollow portion 116 is formed so as to spread in circular form. From this point of view, it is desired that as a method for laying out the etching holes 106, the etching holes 106 are placed or laid out in the center of each infrared detecting device 100 or the etching holes 106 are disposed so as to have symmetry. Since the silicon diodes are placed in the center of each infrared detecting device in FIG. 9(A), the layout of the etching holes having symmetry has been adopted.

When the shape of each device is square (refer also to the patent document 1), the shortest distance between one side of the isolation portion 108 and the etching hole 106 and the distance between the corner of the isolation portion 108 and the etching hole 106 are much different from each other as shown in FIG. 9(C). Therefore, a difference occurs between the timing provided to allow an etchant to reach the one side and the timing provided to allow the etchant to reach the corner.

Thus, there is a possibility that since the etchant reaches the corner after the etchant has reached the side of the isolation portion 108 upon etching processing, the side is over-etched, so that the etchant will reach beyond the isolation portion 108 during this period (refer to the arrow shown in FIG. 9(B)). When the etchant reaches beyond the isolation portion 108, the hollow portions 116 of the adjoining infrared detecting devices 100 are coupled. Therefore, the structure of the infrared detecting device becomes instable physically. The structure is considered also to have a possibility of being lifted off in some cases.

Incidentally, when the etching processing is performed in alignment with the side of the isolation portion 108, there is the potential that the etchant will not reach the corner sufficiently this time. In this case, hollowing cannot be carried out sufficiently.

As means for solving such a problem, there are cited a method for forming the isolation portion 108 deep, and a method for devising the layout of each etching hole 106 to reduce the degree of overetch.

When, however, the former method is adopted, a dedicated deep etcher (DRIE) is required separately. When the latter method is adopted, there is cited a method for opening a large number of etching holes. Since, however, the etching holes 106 cannot be laid out in the areas for forming the silicon diodes 120 and the beam portions 104, there also occurs a case in which the etching holes 106 cannot be placed in their corresponding required locations.

Incidentally, although the, infrared detector in which the hollow portion is formed in the substrate lying below the sensor section, has been included even in the patent document 2, the infrared detector described in this document is not formed with the isolation portion because it is of one formed by a single device or element. Thus, this does not take into consideration the problem that when a plurality of devices are disposed continuously, overetching is done beyond the isolation portion.

SUMMARY OF THE INVENTION

The present invention aims to provide a method for manufacturing an infrared detecting device, which is capable of reducing the amount of overetching that causes etching up to an adjoining infrared detecting area beyond a isolation layer upon etching processing.

According to the invention of a first aspect, for attaining the above object, there is provided a method for manufacturing an infrared detecting device, comprising the steps of preparing an SOI substrate provided with a silicon layer over a support substrate through an oxide layer interposed therebetween; forming a isolation layer which surrounds an infrared detection portion forming area formed in the SOI substrate and extends from the silicon layer to a predetermined depth of the support substrate through the oxide layer; forming a protective film over the surface of the silicon layer corresponding to the infrared detection portion forming area; forming through holes which penetrate the silicon layer, the oxide layer and the protective film; and etching the support substrate corresponding to the infrared detection portion forming area surrounded by the isolation layer to a predetermined depth of the support substrate using the through holes, wherein the isolation layer has a circular form or a form of a regular polygon more than a regular pentagon in shape.

Thus, a isolation layer is shaped in the form of a circle or a regular polygon more than a regular pentagon in shape at the surface of a silicon layer, so that variations in the distance and timing at which an etchant supplied via through holes upon etching processing are suppressed. It is therefore possible to reduce the amount of overetching.

The invention according to a second aspect is provided wherein in the invention described in the first aspect, one of the through holes is formed in a central part of the infrared detection portion forming area or the through holes are formed in plural form at equal intervals on a circumference with the center of the infrared detection portion forming area as the center in the through hole forming step.

With the formation of the through holes in this way, variations in the distance and timing at which the etchant supplied via the through holes upon etching processing reaches the isolation layer are suppressed, thus making it possible to reduce the amount of overetching.

The invention according to a third aspect is provided wherein the isolation layer has an orthohexagonal shape at the surface of the silicon layer.

With the shaping of the isolation layer in the form of the orthohexagon in this way, a plurality of infrared detection portion forming areas or regions can be arranged with no space therebetween, thus making it possible to reduce the entire area.

The invention according to a fourth aspect is provided wherein the infrared detection portion forming area and other infrared detection portion forming areas are separated by the isolation layer.

With the configuration being taken in this way, the adjoining infrared detection portion areas can be surrounded by the common isolation layers, thus making it possible to reduce the entire area.

The invention according to a fifth aspect is provided which further includes the steps of forming an infrared reflection layer for reflecting infrared radiation over the protective film, and forming an infrared absorbing portion over the infrared reflection layer.

The invention according to a sixth aspect is provided wherein infrared detection portions formed in the adjoining infrared detection portion forming areas separated by the isolation layer are respectively electrically connected via a metal layer uncovered with the protective film, and which further includes the steps of forming a conduction preventing film over the protective film and the metal layer, forming an infrared reflection layer for reflecting infrared radiation over the conduction preventing film, and forming the infrared absorbing portion over the infrared reflection layer.

According to the inventions described in the fifth and sixth aspects, it is possible to cause the infrared reflection layer to reflect the infrared radiation penetrated without being absorbed by the infrared absorbing portion and to launch the same into the infrared absorbing portion as well as to cause each infrared detection portion to detect a change in temperature produced due to the absorption of the infrared radiation by the infrared absorbing portion. Therefore, infrared detection efficiency is enhanced.

In the infrared absorbing portion as in the invention described in a seventh aspect, a sacrifice layer is formed over the infrared reflection layer and the sacrifice layer is removed after the formation of the infrared absorbing portion over the sacrifice layer, whereby the infrared absorbing portion may be formed in such a manner that space is formed between at least part of the infrared absorbing portion and the infrared reflection film.

According to the present invention as described above, an advantageous effect is brought about in that the amount of overetching that causes etching up to each adjoining infrared detecting area beyond a isolation layer upon etching processing can be reduced.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

A preferred embodiment of the present invention will hereinafter be described in detail with reference to the accompanying drawings.

Figure 1:
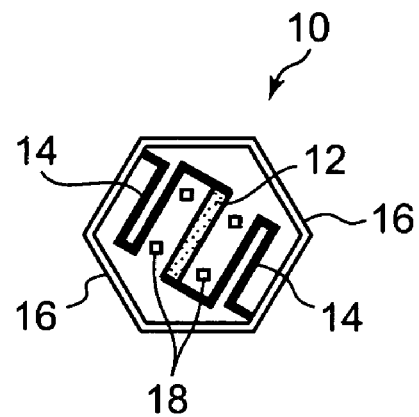
FIG. 1 is a plan view typically showing an infrared detecting device according to an embodiment of the present invention.
Figure 2:
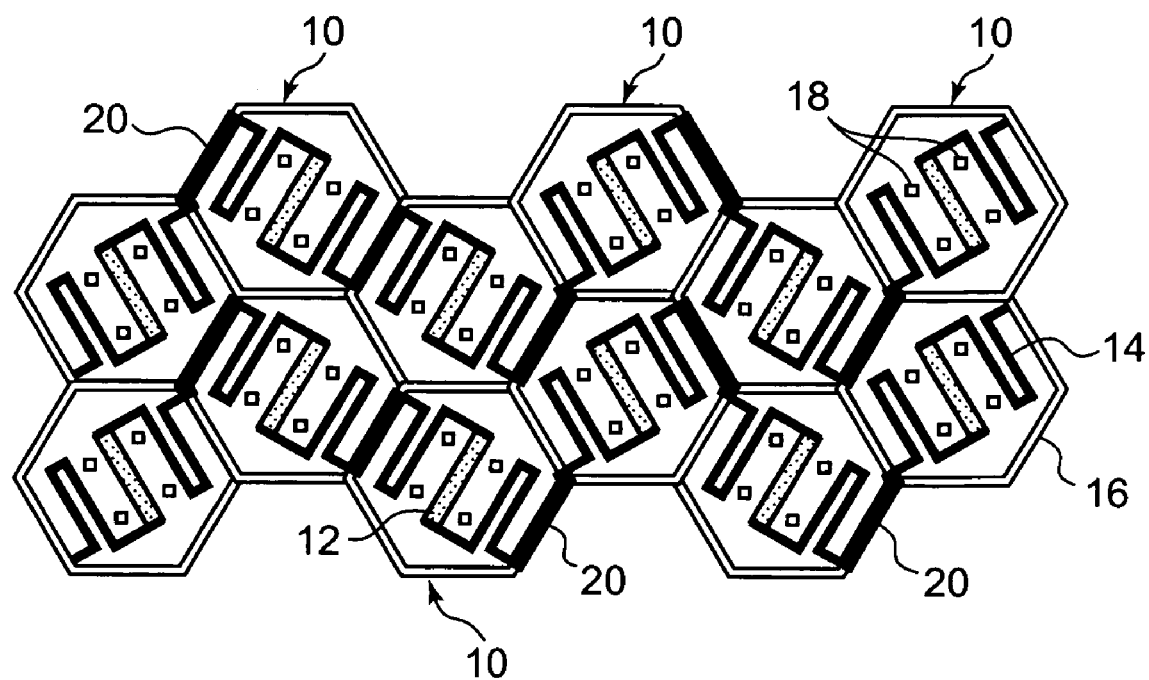
FIG. 2 is a layout example of a plurality of infrared detecting devices where they are disposed in linked form.

FIG. 1 is a plan view typically showing an infrared detecting device 10 according to one embodiment. FIG. 2 is a layout example of a plurality of the infrared detecting devices 10 where they are disposed in linked form. The infrared detecting device 10 includes a silicon diode unit or section 12 in which a plurality of silicon diodes are connected in series, and detects infrared radiation or rays using the temperature characteristics of each silicon diode whose output voltage changes when the temperature changes under constant current environment. Each of the infrared detecting devices 10 is provided with beam portions 14 each used as a support body for supporting the silicon diode section 12 in addition to the silicon diode section 12 and includes metal wirings or the like (not shown) for transmitting electric signals and an infrared absorber 22 (refer to FIG. 3) for absorbing incident infrared radiation, transforming it to heat and transmitting the same to the silicon diode section 12.

Further, each infrared detecting device 10 has an orthohexagonal device isolation or separation portion 16. Areas for forming the infrared detecting devices 10 are separated from one another by the isolation portions 16. As shown in FIG. 2, the orthohexagonal infrared detecting devices 10 are disposed with no space therebetween thereby to form a honeycomb structure. Thus, an infrared detector small in area and high in sensitivity is formed as a whole. Incidentally, the respective infrared detecting devices 10 are electrically connected to one another via metals 20 (e.g., aluminium or the like).

Incidentally, while two series connections in which the six infrared detecting devices 10 are arranged in linked form in FIG. 2, are provided side by side in a lateral direction, the two series, connections are linked in an electrically separated state (non-overlapped state) without acting on each other under a state in which the infrared detecting devices 10 are being arranged with no spaces therebetween. Thus, even when an apparatus in which many infrared detecting devices 10 are coupled in series, is manufactured, they can be folded back and coupled long and hence the apparatus can be manufactured with being reduced in overall area.

Figure 3A:
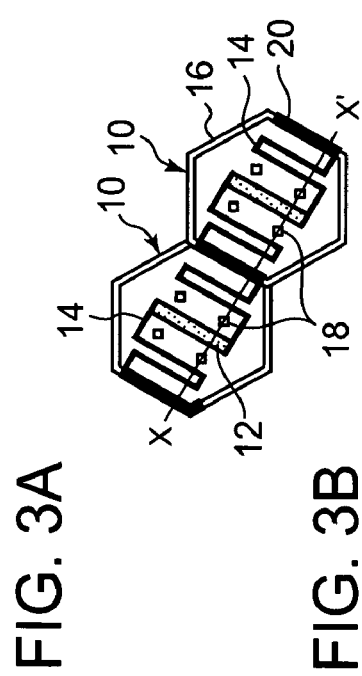
FIG. 3(A) is a typical view showing two infrared detecting devices disposed and connected adjacent to each other.
Figure 3B:
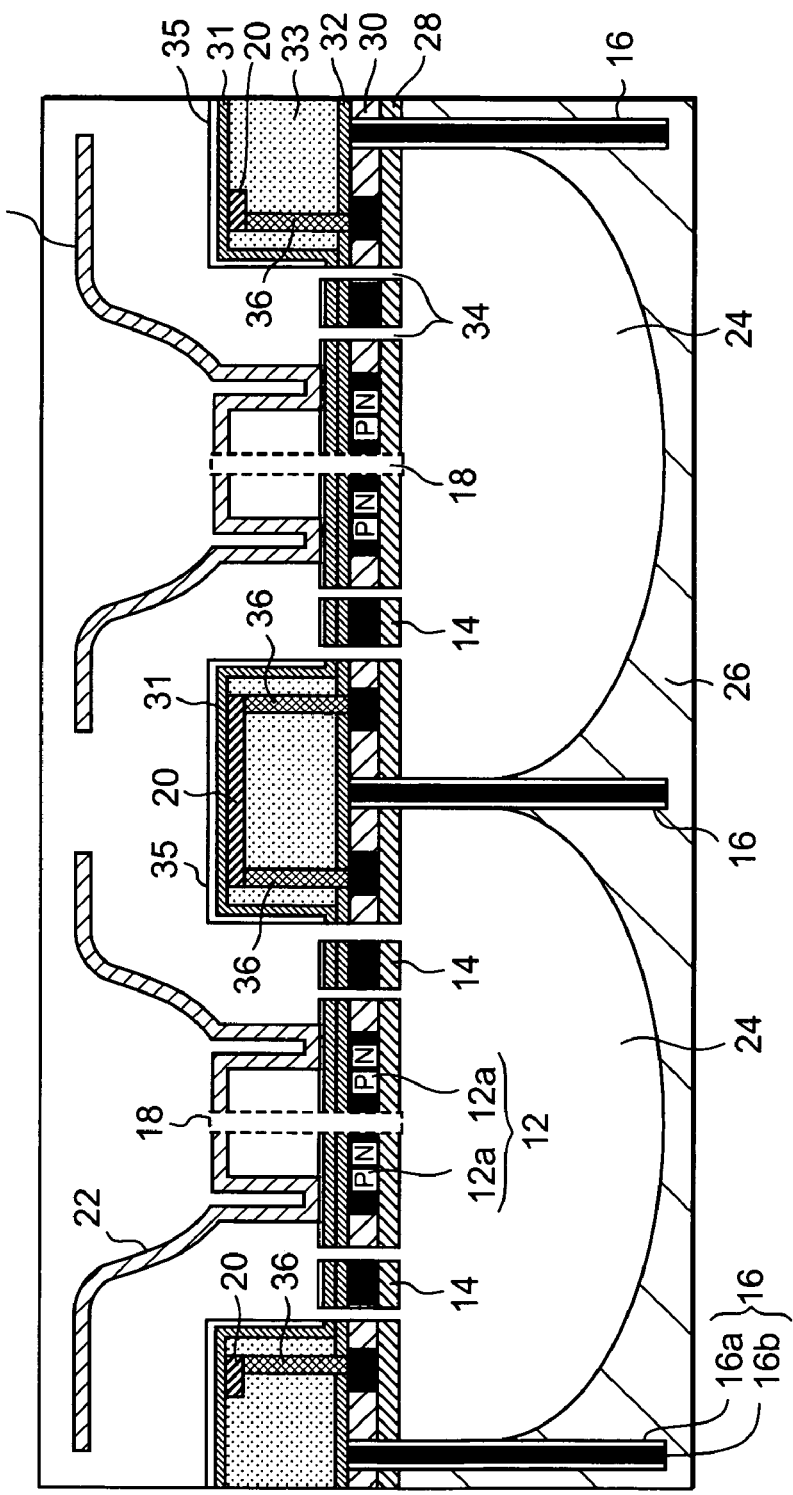
FIG. 3(B) is a sectional view of the two infrared detecting devices shown in FIG. 3(A) cut along line X-X' of FIG. 3(A)

FIG. 3(B) is a sectional view cut along line X-X' of FIG. 3(A), of the two infrared detecting devices 10 disposed and connected adjacent to each other as shown in FIG. 3(A). Incidentally, metal wirings for signal transmission are omitted herein.

A BOX layer (Buried Oxide layer) 28, an SOI layer (Silicon On Insulator and hereinafter called silicon layer) 30 and a protective film 32 such as a nitride film are laminated or stacked on a silicon substrate 26. A silicon diode section 12 in which a plurality of silicon diodes 12a each comprised of n-type and p-type regions are connected in series, is formed on the SOI layer 30 of these. Incidentally, while the silicon diode section 12 is illustrated in the form of one rectangle in a simplified manner in FIGS. 1, 2 and 3(A), this sectional view (FIG. 3(B)) illustrates one placed in a state in which the silicon diodes 12a are being connected in series and disposed with being folded back.

A hollow portion 24 is formed below the silicon diode section 12. Beam portions 14 each used as a supporter or support body for supporting the silicon diode section 12 in floating form are provided on the hollow portion 24. Incidentally, beam-extracted portions 34 for forming the beam portions 14 are buried by polyimide or the like when each etching hole 18 is opened.

Thus, the silicon substrate 26 lying below each silicon diode section 12 is hollowed out thereby to enhance the rate of rise in temperature of a sensing portion.

The silicon substrate 26 is provided with isolation portions 16 each of which assumes the role of an etching stopper for preventing the attainment of an etchant to each infrared detecting device 10 upon formation of the hollow portion 24 by etching processing. The isolation portion 16 has outer sides each covered with an oxide film (TEOS) 16a and an inner side comprised of polysilicon 16b. Incidentally, while the two etching holes 18 for supplying the etchant (XeF2 gas, for example) upon etching processing exist in one infrared detecting device 10 as viewed on line X-X' of the top view shown in FIG. 3(A), only one etching hole 18 is illustrated in the center thereof as viewed in the sectional view of FIG. 3(B).

An infrared absorber 22 is provided above each silicon diode section 12. The infrared absorber 22 is configured in such a manner that a rise in temperature produced due to the absorption of infrared radiation or rays by the infrared absorber 22 is transmitted to the silicon diode section 12. Each silicon diode of the silicon diode section 12 changes in its output voltage according to a change in temperature under a constant current state. Consequently, the infrared rays are detected.

The respective infrared detecting devices 10 are electrically connected to one another via their corresponding metals 20. The metals 20 and the silicon diode section 12 (silicon diodes 12a) provided in the silicon substrate 26 are electrically connected to one another via contact holes 36. Described in more detail, one end of the metal 20 is connected to one end of the contact 36 provided in one of the adjoining infrared detecting devices 10, whereas the other end of th meal 20 is connected to the end of the contact hole 36 provided in the other of the adjoining infrared detecting devices 10. The ends of the silicon diode sections 12 (silicon diodes 12a) of the respective infrared detecting devices 10 are connected to their corresponding other ends of the contact holes 36. Incidentally, an insulating film 33 is formed around the contacts 36 and the metals 20. A conduction preventing film 31 (nitride film or the like similar to the protective film 32) is formed on the surface of the insulating film 33. Further, a reflection film 35 is formed on the surface of the conduction preventing film 31.

A method for manufacturing an infrared detecting device having a isolation structure will now be explained concretely. FIGS. 4 through 6 are respectively views for describing a process for forming a isolation portion 16. Incidentally, while since processing steps shown in FIGS. 4 through 6 are illustrated over different figure numbers because they are a serried of processes, they will be explained with being marked with alphabetical through signs of (A) through (G).

Figure 4A:
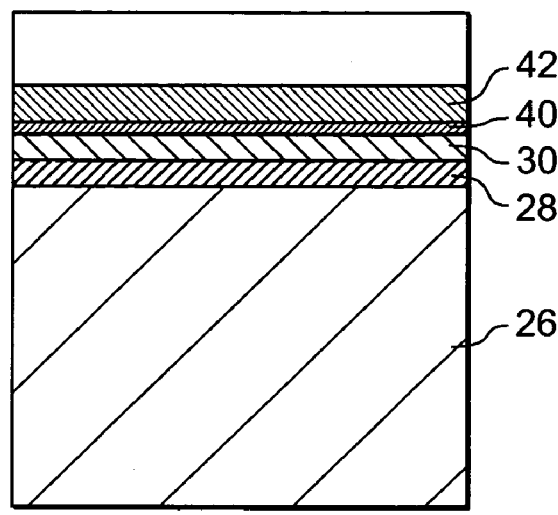
FIG. 4 is a view for describing a process for forming a isolation portion.

As shown in FIG. 4(A), a Pad oxide film 40 and a silicon nitride film (SiN layer) 42 are first deposited on a semiconductor layer in which a silicon substrate 26, a BOX layer 28 and an SOI layer 30 are stacked on one another in this order. A method for forming Pad oxide film 40 and the silicon nitride film 42 is identical to a conventional STI (Shallow Trench Isolation) forming method (refer to, for example, Japanese Unexamined Patent Publication No. 2006-108423).

Figure 4B:
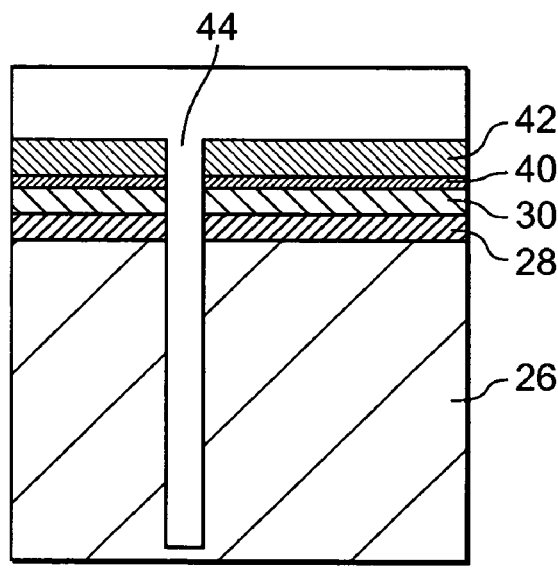

Subsequently, as shown in FIG. 4(B), trench etching is done to form a trench 44 to a predetermined depth. The trench etching is carried out in accordance with the known photolithography step and etching step. Incidentally, the etching step may be performed using DRIE (Deep Reactive Ion Etching) technology. Alternatively, the etching step may be performed by a general etching apparatus employed in STI technology.

Figure 4C:
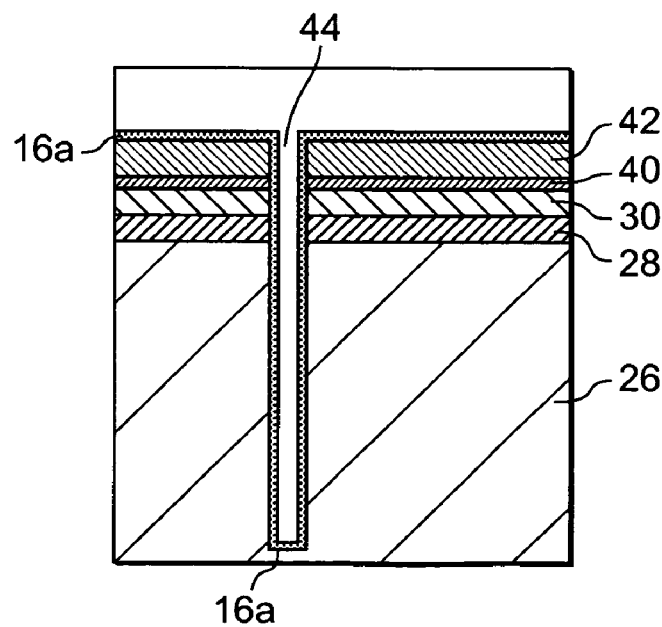

Next, an oxide film (TEOS) 16a is formed as shown in FIG. 4(C). It is essential that the oxide film 16a is formed to prevent erosion by an etchant (xenon fluoride (XeF2) in the present embodiment). Incidentally, while a thermal oxide film (trench oxide film) is formed in a conventional STI technique, a principal purpose for forming this film is to hold insulation between adjoining gates. This is different in implication from the isolation related to the present embodiment.

Figure 5D:
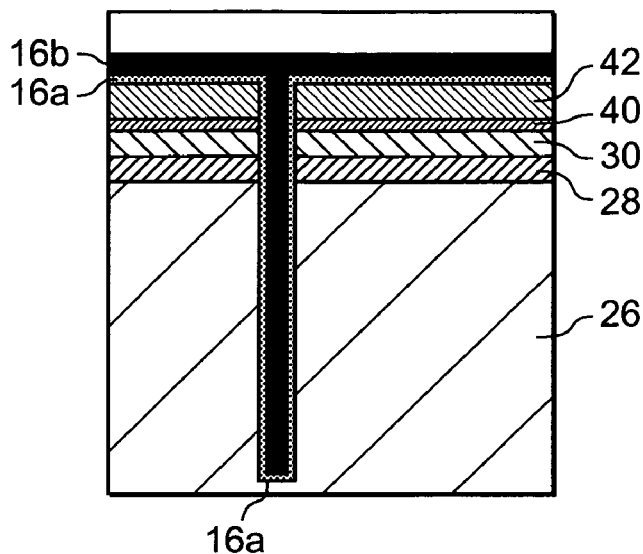
FIG. 5 is a view for describing the process for forming the isolation portion.

Subsequently, polysilicon 16b is formed on the oxide film 16a as shown in FIG. 5(D). Incidentally, films other than polysilicon may be used if ones are adopted which are insulators and easy to be embedded.

Figure 5E:
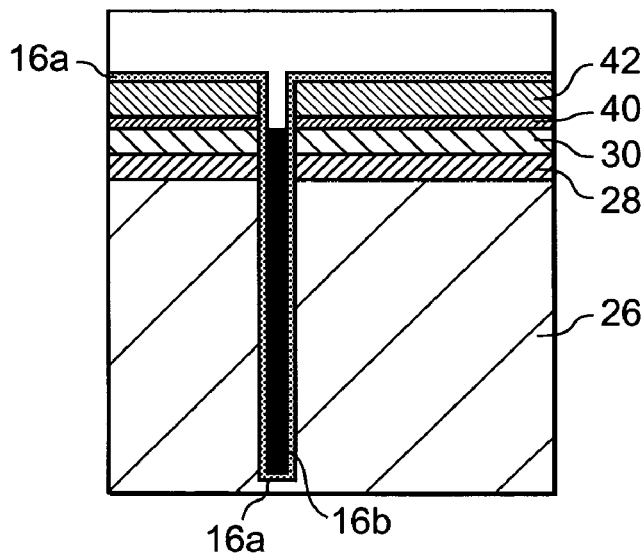

Next, as shown in FIG. 5(E), the polysilicon 16b is removed up to the same height as that of the SOI layer 30.

Figure 5F:
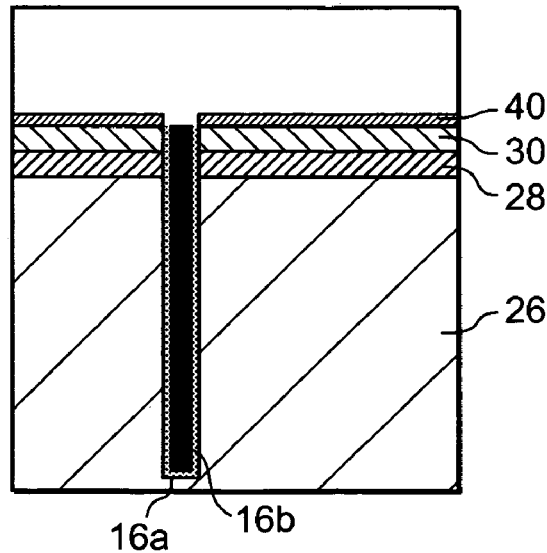

Further, as shown in FIG. 5(F), the oxide film 16a is removed up to the same height as that of the SOI layer 30 and the silicon nitride film 42 is removed.

Figure 6G:
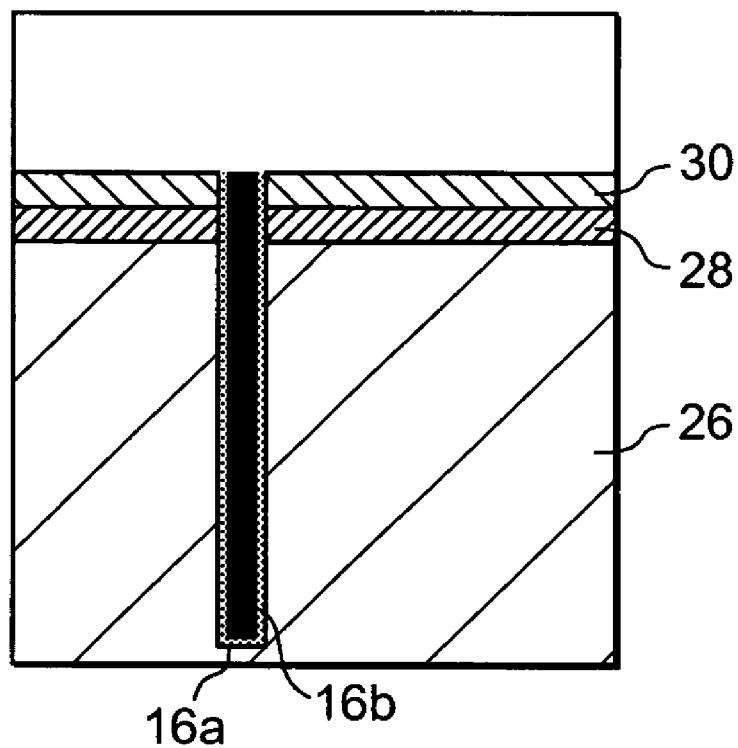
FIG. 6 is a view for describing the process for forming the isolation portion.

Finally, the Pad oxide film 40 is eliminated as shown in FIG. 6(G).

The isolation portion 16 shaped in the form of a circle or a regular polygon (orthohexagon in the present embodiment) more than a regular pentagon in shape is formed in accordance with such steps.

Furthermore, the plural infrared detecting devices 10 are coupled and formed to manufacture one infrared detector in the present embodiment as shown in FIG. 2. At this time, however, the isolation portions 16 are formed in such a manner that some of the isolation portions 16 of the adjoining infrared detecting devices 10 are used in common. Since the isolation portions 16 have orthohexagonal shapes respectively here, they are formed in such a manner that one sides of the orthohexagons are common.

After the formation of the isolation portions 16 as described above, a silicon diode section 12 is formed in the SOI layer 30 and a protective film 32 is laminated thereon. An insulating film 33 is laminated on the protective film 32 and contact holes are formed or defined in the insulating film 33. Afterwards, a metal material is embedded into the contact holes to form buried contacts 38. Further, a metal 20 is formed above each contact 38. A known method may be used for the formation of the contacts 38. For example, a process step for sequentially forming a titanium film and a titanium nitride film in each contact hole and thereafter embedding a tungsten film therein is performed.

Thereafter, the area of the insulating film 33 in which each infrared absorber 22 is formed, is etched by dry (gas) processing to provide an opening. Since erosion proceeds anisotropically here, the erosion almost never occurs in the lateral direction. After a conduction preventing film 31 has been formed on the surface (on the proactive film 32 and the metals 20), a reflection film 35 such as a metal (aluminum or the like, for example) is formed on the conduction preventing film 31. A view for describing this process step will be omitted. The reflection film 35 is provided to reflect infrared rays penetrated without being absorbed by each infrared absorber 22 and launch the same into the infrared absorber 22. The conduction preventing film 31 functions as a buffer film for preventing the reflection film 35 often comprised of the metal from being brought into direct contact with the metals 20. Incidentally, although such a configuration that the reflection film 35 is not formed can also be adopted, it may more preferably be formed to enhance heat absorption efficiency of the infrared absorber 22.

A process step for opening or defining each etching hole and performing etching processing thereon will next be explained with reference to FIG. 7.

Figure 7A:
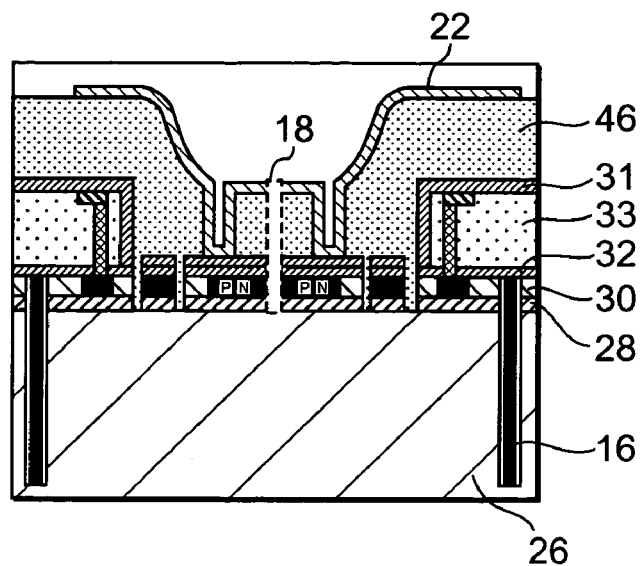
FIG. 7 is a view for describing a process for opening or defining an etching hole and performing etching processing.

As shown in FIG. 7(A), a sacrifice film 46 is laminated on its corresponding reflection film 35 (which is not illustrated in FIG. 7) by polyimide or the like. Further, an infrared absorber 22 is formed thereon. Afterwards, an etching hole 18, which penetrates the infrared absorber 22, reflection film 35, conduction preventing film 31, protective film 32, sacrifice layer 46, SOI layer 30 and BOX layer 28 along the direction in which they are laminated on one another, is opened. The opening of each etching hole 18 is performed in accordance with the known photolithography step and etching step.

Incidentally, each etching hole 18 is formed in an area other than areas in which the silicon diode section 12 and the beam portions 14 are formed. For example, the etching hole 18 is formed in an area for each beam-extracted portion 34 formed after the etching processing, or the like.

The etching hole 18 is preferably provided one in the central part of the infrared detecting device 10. Alternatively, a plurality of (four) etching holes 18 may preferably be provided in such a manner that the distances to the isolation portion 16 become equal, and provided at equal intervals on the circumference with the center of the infrared detecting device 10 defined as the center. Namely, the respective etching holes 18 are laid out so as to have symmetry. Consequently, the amounts of etching by the etching holes 18 become uniform. In any case, the etching holes 18 are provided at the parts other than the parts where the silicon diode section 12 and the beam portions 14 are disposed.

Although etching is carried out after the formation of the infrared absorber 22 herein, the infrared absorber 22 may be formed after etching.

Figure 7B:
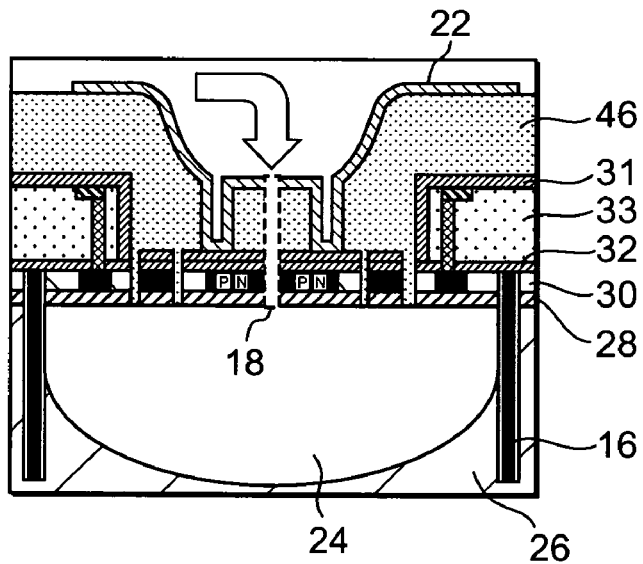

Subsequently, as shown in FIG. 7(B), XeF2 gas is supplied through each etching hole 18 to perform silicon etching. Consequently, a hollow portion 24 is formed.

Figure 7C:
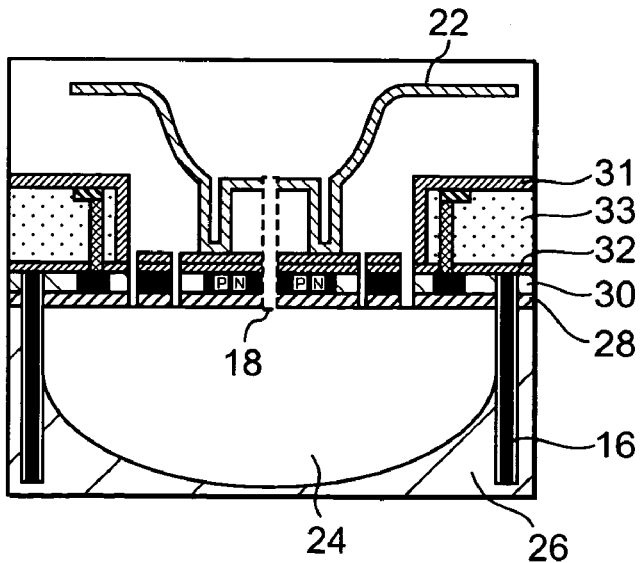

Next, as shown in FIG. 7(C), the sacrifice film 46 is, eliminated. Since polyimide employed in the sacrifice layer 46 is of an organic substance, it is removed using oxygen or ozone.

The etching processing has been performed as described above. Since, however, the isolation portion 16 has the form of the regular polygon (orthohexagon herein) more than the pentagon in shape as described above at this time, the amount of overetch can be reduced as compared with the case where the isolation portion 16 is square.

Described more concretely, since a variation in the distance between each etching hole 18 and the isolation portion 16 is suppressed as compared with the case in which the isolation portion 16 is square, a variation in timing provided to allow XeF2 gas to reach the isolation portion 16 is reduced. Thus, the amount of overetch is reduced.

The amount of overetch where the infrared detecting device 10 (isolation portion 16) is square and the amount of overetch where it is orthohexagonal, will now be explained by comparison using FIG. 8.

Figure 8A:
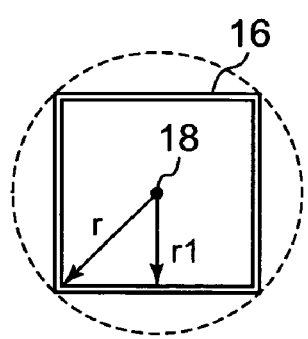
FIG. 8(A) is a view showing a difference in reaching distance for etching between one side of a square infrared detecting device and its corner where the infrared detecting device is square.
Figure 8B:
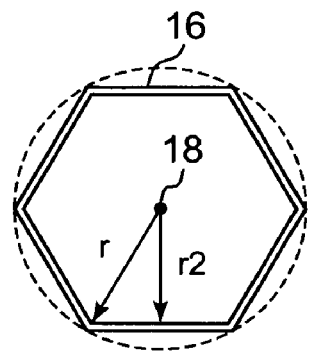
FIG. 8(B) is a view showing a difference in reaching distance for etching between one side of an orthohexagonal infrared detecting device and its corner where the infrared detecting device is orthohexagonal.
Figure 9A:
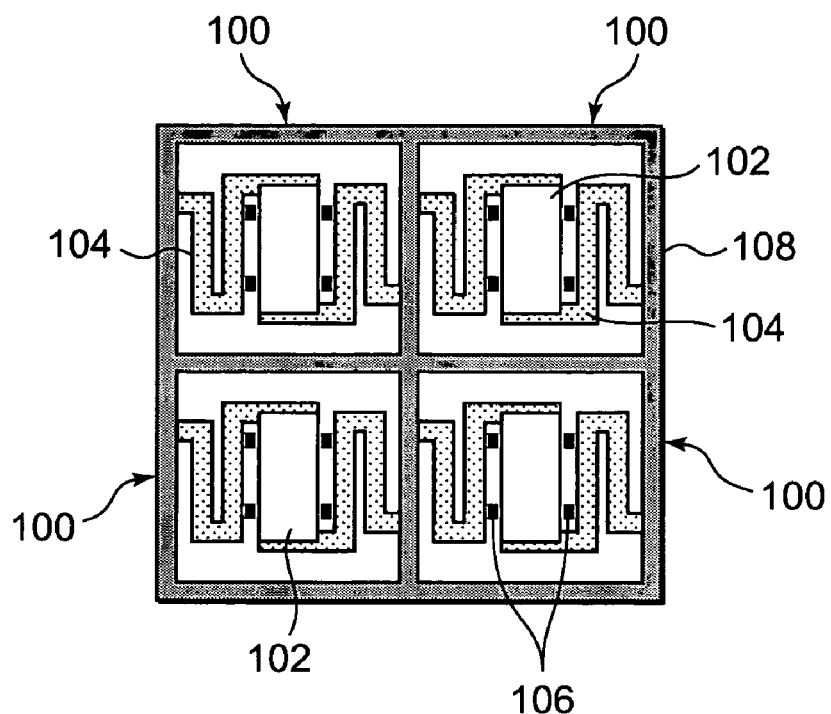
FIG. 9(A) is a layout example of square infrared detecting devices are arranged in coupled or linked form.
Figure 9B:
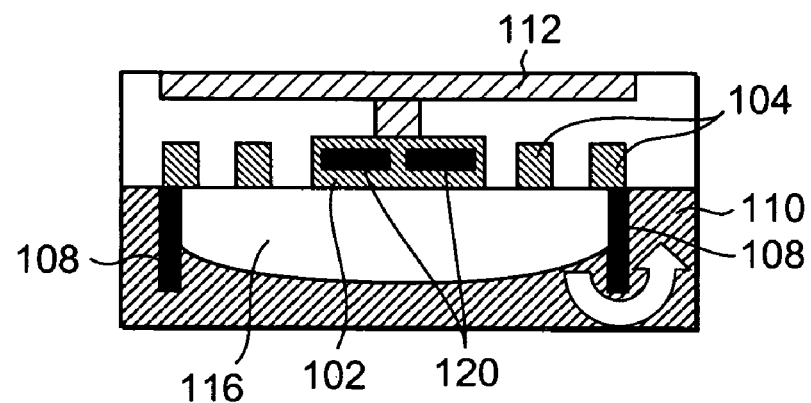
FIG. 9(B) is a view typically showing one example of a sectional view of the infrared detecting devices and FIG. 9(C) is a view for describing a difference between the distance from one side of a isolation portion to an etching hole and the distance from its corner to the etching hole.
Figure 9C:
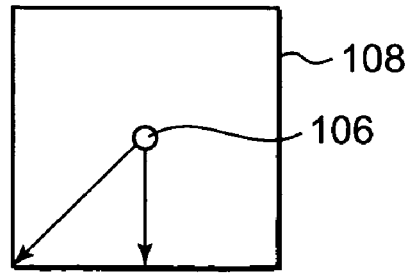

FIG. 8(A) is a view showing a difference in reaching distance for etching between one side of a square infrared detecting device 10 and its corner where the infrared detecting device 10 is square. FIG. 8(B) is a view showing a difference in reaching distance for etching between one side of an orthohexagonal infrared detecting device 10 and its corner where the infrared detecting device 10 is orthohexagonal. A description will now be made of, as an example, where one etching hole 18 exists in the center of the infrared detecting device 10 for convenience.

When the infrared detecting device 10 is of a square tangent to the inside of a circle whose radius is r as shown in FIG. 8(A), the distance between the etching hole. 18 and the corner of the isolation portion 16 becomes r. At this time, the shortest distance r1 from the etching hole 18 to one side of the isolation portion 16 can be calculated as follows:

$$r1 = r\cos(\pi/4) = 1\sqrt{2}r \approx 0.71r.$$

Thus, 0.29r obtained by subtracting 0.71r from r is determined as the amount of overetch.

When the infrared detecting device 10 is of an orthohexagon tangent to the inside of a circle whose radius is r as shown in FIG. 8(B), the distance between the etching hole 18 and the corner of the isolation portion 16 reaches r in a manner similar to the square. At this time, the shortest distance r2 from the etching hole 18 to one side of the isolation portion 16 can be calculated as follows:

$$r2 = r\cos(\pi/6) = 1\sqrt{3/2}r \approx 0.87r.$$

Thus, 0.13r obtained by subtracting 0.87r from r is determined as the amount of overetch.

As described above, the orthohexagonal isolation portion 16 is reduced in overetch amount as compared with the square isolation portion 16. Thus, the risk of the etchant reaching beyond the isolation portion 16 can be reduced.

Incidentally, although the present embodiment has descried where the orthohexagonal infrared detecting device 10 (isolation portion, 16) is formed, the present invention is not limited to it. Since the amount of overetch can be reduced as the number of the sides of the regular polygon increases, although depending on the balance with an arrangement method and the degree of difficulty in photolithography processing, another regular polygonal shape (where it is more than the regular pentagon in shape) may be adopted. Further, if the circular form is taken, then the distance from the etching hole 18 placed in the center of the infrared detecting device 10 to the isolation portion 16 can be held uniform at any portion. Therefore, overetch can be resolved and the formation of a isolation area or region becomes unnecessary.

Although the present embodiment has described the example in which each infrared absorber 22 is formed after the formation of the reflection film 35, the infrared absorber 22 may be formed over the protective film 32 after the formation of the protective film 32 in the case of such a configuration that no reflection film 35 is formed. Upon the etching processing described using FIG. 7 in this case, etching is performed similarly in a state in which the conduction preventing film 31 and the reflection film 35 are not formed.

On the other hand, when the infrared detecting device 10 (isolation portion 16) is formed as orthohexagonal, the following advantages are further brought about.

When the infrared detecting devices 10 are used with being arranged in plural form, space or clearances (needless areas) are formed when the circular infrared detecting devices 10 are arranged. Even in the case of regular pentagonal and octagonal infrared detecting devices 10, clearances are formed. On the other hand, since the orthogonal infrared detecting devices 10 can be arranged with no space therebetween as is apparent from FIG. 2, an overall area can be reduced.

While the preferred form of the present invention has been described, it is to be understood that modifications will be apparent to those skilled in the art without departing from the spirit of the invention. The scope of the invention is to be determined solely by the following claims.

What is claimed is:

1. A method for manufacturing an infrared detecting device, comprising:

preparing an SOI substrate provided with a silicon layer over a support substrate through an oxide layer interposed therebetween;

forming a isolation layer which surrounds an infrared detection portion forming area formed in the SOI substrate and extends from the silicon layer to a predetermined depth of the support substrate through the oxide layer;

forming a protective film over the surface of the silicon layer corresponding to the infrared detection portion forming area;

forming through holes which penetrate the silicon layer, the oxide layer and the protective film; and etching the support substrate corresponding to the infrared detection portion forming area surrounded by the isolation layer to a predetermined depth of the support substrate using the through holes, wherein the isolation layer has a circular form or a form of a regular polygonal more than a regular pentagon in shape.

2. The method according to claim 1, wherein in the through hole forming step, one of the through holes is formed in a central part of the infrared detection portion forming area or the through holes are formed in plural form at equal intervals on a circumference with the center of the infrared detection portion forming area as the center.

3. The method according to claim 1, wherein the isolation layer has an orthohexagonal shape at the surface of the silicon layer.

4. The method according to any one of claim 1, wherein the infrared detection portion forming area and other infrared detection portion forming areas are separated by the isolation layer.

5. The method according-to any one of claim 1, further including:

forming an infrared reflection layer for reflecting infrared radiation over the protective film, and forming an infrared absorbing portion over the infrared reflection layer.

6. The method according to any one of claim 1, wherein infrared detection portions formed in the adjoining infrared detection portion forming areas separated by the isolation layer are respectively electrically connected via a metal layer uncovered with the protective film, further including:

forming a conduction preventing film over the protective film and the metal layer, forming an infrared reflection layer for reflecting infrared radiation over the conduction preventing film, and forming the infrared absorbing portion over the infrared reflection layer.

7. The method according to claim 5, wherein in the infrared absorbing portion forming step, a sacrifice layer is formed over the infrared reflection layer and the sacrifice layer is removed after the formation of the infrared absorbing portion over the sacrifice layer, thereby forming the infrared absorbing portion in such a manner that space is formed between at least part of the infrared absorbing portion and the infrared reflection film.

* * * * *